(12) United States Patent
Bartlow et al.

(10) Patent No.: US 8,288,845 B2
(45) Date of Patent: Oct. 16, 2012

(54) PACKAGE INCLUDING PROXIMATELY-POSITIONED LEAD FRAME

(75) Inventors: Howard Bartlow, Longmont, CO (US); William McCalpin, Boulder, CO (US); Michael Lincoln, Longmont, CO (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 846 days.

(21) Appl. No.: 12/271,827

(22) Filed: Nov. 14, 2008

(65) Prior Publication Data

US 2010/0123228 A1    May 20, 2010

(51) Int. Cl.
*H01L 23/48*    (2006.01)
*H01L 23/495*    (2006.01)

(52) U.S. Cl. ........ 257/675; 257/688; 257/692; 257/706; 257/707; 257/717; 257/728; 257/732; 257/E23.004; 257/E23.083; 257/E23.135

(58) Field of Classification Search ................. 257/675, 257/688, 692, 706, 707, 717, 728, 732, E23.004, 257/E23.083, E23.135
See application file for complete search history.

(56) References Cited

U.S. PATENT DOCUMENTS

| | | | |
|---|---|---|---|
| 6,762,079 B2 * | 7/2004 | Vaiyapuri | 438/123 |
| 7,268,426 B2 * | 9/2007 | Warner et al. | 257/707 |
| 2002/0027271 A1 * | 3/2002 | Vaiyapuri | 257/676 |
| 2002/0081775 A1 * | 6/2002 | Vaiyapuri | 438/111 |
| 2002/0124396 A1 * | 9/2002 | Wark et al. | 29/831 |
| 2004/0238934 A1 * | 12/2004 | Warner et al. | 257/686 |
| 2009/0244928 A1 * | 10/2009 | Yang et al. | 363/16 |
| 2009/0309199 A1 * | 12/2009 | Barkley | 257/676 |
| 2010/0032693 A1 * | 2/2010 | Sugiura et al. | 257/88 |
| 2010/0203283 A1 * | 8/2010 | Zimmerman | 428/114 |
| 2011/0065241 A1 * | 3/2011 | Lin et al. | 438/118 |
| 2011/0079811 A1 * | 4/2011 | Lin et al. | 257/98 |

FOREIGN PATENT DOCUMENTS

| | | |
|---|---|---|
| JP | 04-306865 A | 10/1992 |
| JP | 2003-197803 A | 7/2003 |
| JP | 2005-252018 A | 9/2005 |

* cited by examiner

*Primary Examiner* — Ngan Ngo
(74) *Attorney, Agent, or Firm* — Schwabe Williamson & Wyatt

(57) ABSTRACT

Embodiments of a microelectronic package are generally described herein. A microelectronic package may include a die having a first side and a second side, opposite the first side, a flange coupled to the first side of the die, and a lead frame proximately positioned relative to the die and coupled to the second side of the die. Other embodiments may be described and claimed.

16 Claims, 5 Drawing Sheets

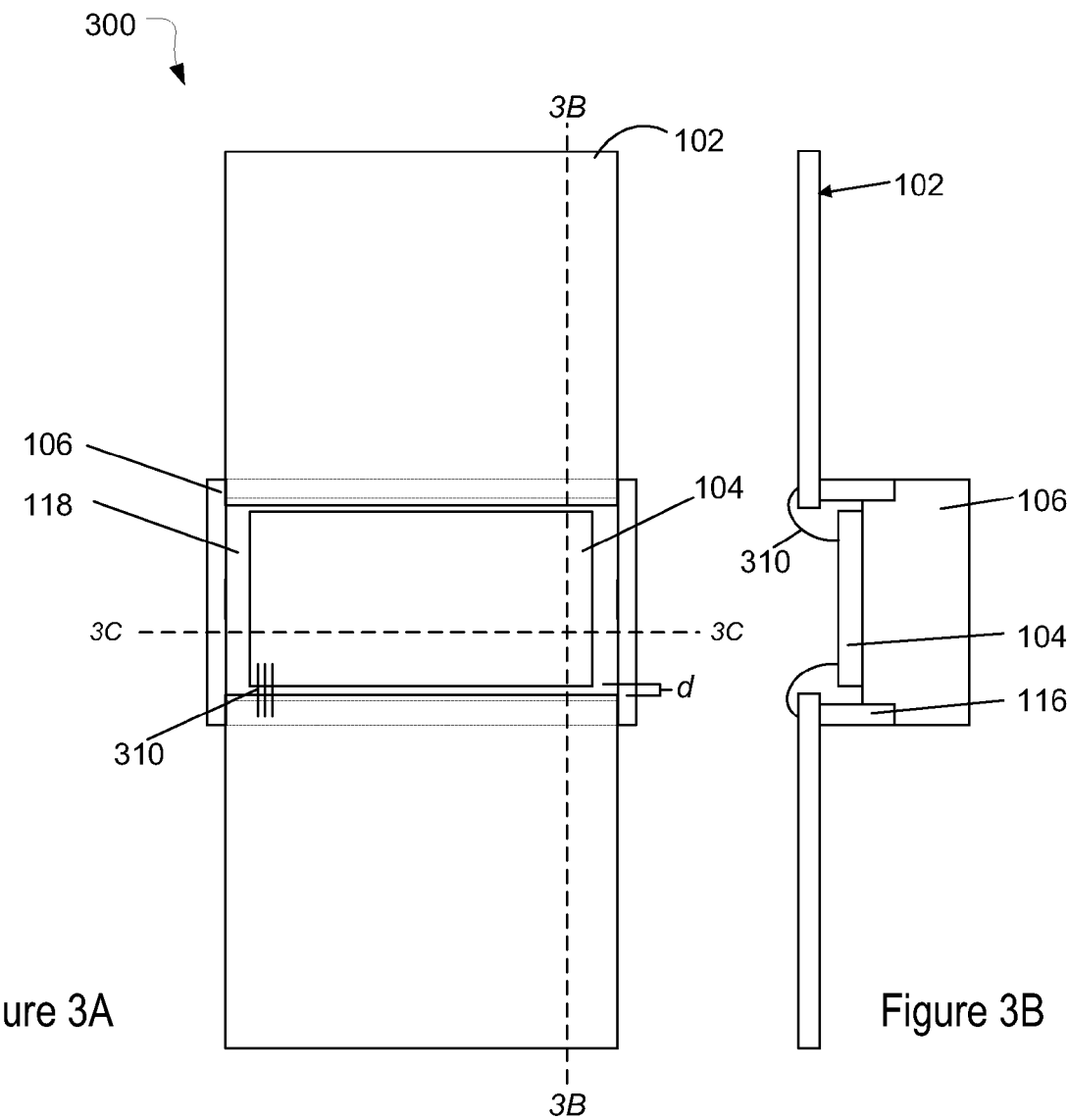
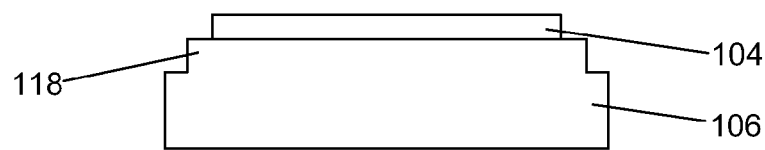

_US 8,288,845 B2_

PACKAGE INCLUDING PROXIMATELY-POSITIONED LEAD FRAME

TECHNICAL FIELD

Embodiments of the present disclosure relate generally to microelectronic packaging, and more particularly, to packages including a lead frame proximately positioned to a die.

BACKGROUND

The design of high-power radio frequency (RF) devices capable of operating at high frequencies and bandwidths has generally involved minimizing impedances in order to produce high power levels at high frequencies while at the same time controlling the heat output associated with high-power operation in order to avoid functional failure. Small reactive impedances are usually associated with smaller dimensions. Smaller dimensions, however, may lead to the heat problem associated with high-power applications.

A method involving band-splitting, processing signals with multiple narrowband circuits, and then summing or multiplexing the results has been used for achieving broader bandwidths. This technique, however, may require tuning individual circuits to match specific impedances to avoid signal loss due to unbalanced loads and line reflections. If impedances are mismatched, individual RF power transistors in the individual circuits are sometimes surrounded by passive components, such as resistors, capacitors, and inductors, and each RF power transistor may be tuned at its inputs and outputs with the addition of external, or off-chip, passive components. Even though some passive components can be formed on-chip, inductors generally must remain off-chip, leading to large transistor devices with complex and area-consumptive external passive impedance matching networks.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments of the disclosure are illustrated by way of example and not by way of limitation in the figures of the accompanying drawings.

FIGS. 3A-3C are plan, cross-sectional side, and cross-sectional end views, respectively, of another microelectronic package in accordance with various embodiments.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element. In addition, although embodiments of the present invention may be shown and described as including a particular number of components or elements, embodiments of the invention are not limited to any particular number of components or elements.

Figure 1:
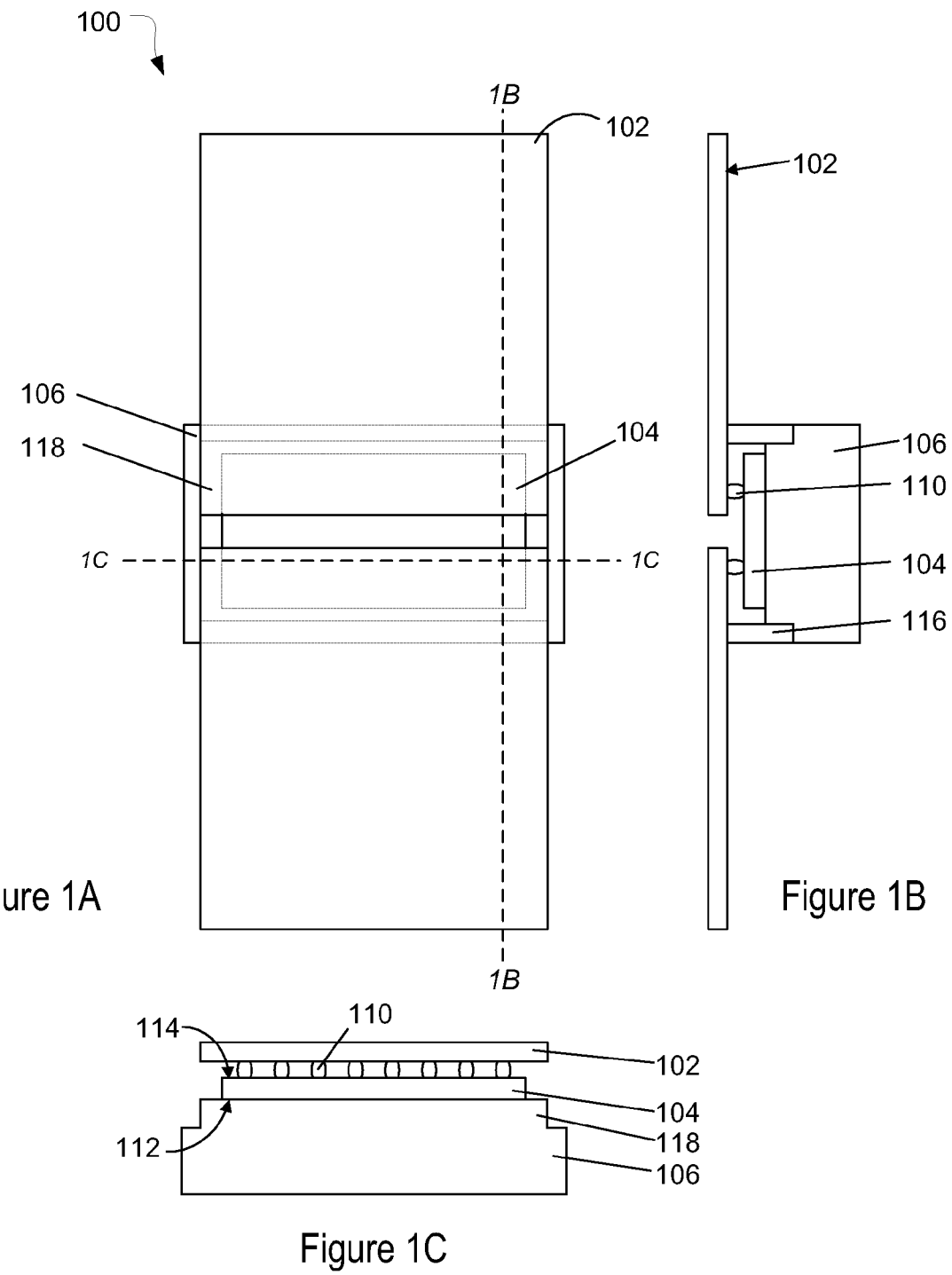
FIGS. 1A-1C are plan, cross-sectional side, and cross-sectional end views, respectively, of a microelectronic package in accordance with various embodiments.

Turning now to FIGS. 1A-1C, illustrated are views of an exemplary microelectronic package 100 including a lead frame 102 proximately positioned relative to a die 104. As illustrated, the lead frame 102 is cantilevered over the die 104.

By configuring the lead frame 102 directly over the die 104, a dramatic reduction in the overall area and dimensions of the package 100 may be achieved, particularly with respect to the input-to-output distance. Input-to-output distances of less than 150 mils (3.8 mm), and in some embodiments, even less than 90 mils (2.3 mm) may be achieved in various embodiments. As transmission line lengths have been shortened, this reduction in dimensions may also achieve reduced parasitic series inductances between the input and the die 104, and between the die 104 and the output, relative to a package with a greater input-to-output distance.

Moreover, high power may be attainable, with thermal resistances low enough to enable superior RF performance over multi-octave frequency bandwidths and with excellent efficiency, power, and gain. In various embodiments, power on the order of 20 watts (W) to 60 W or more may be achieved with a package having a size of 90 mils (approximately 2.3 millimeters) or less from input-to-output, while power levels of 60 W to 150 W or more may be achieved with a package having a size of 150 mils (approximately 3.8 millimeters). Accordingly, although convention has taught away from reduction in size of high-power devices, embodiments described herein may include small, high-power transistor packages.

The die 104 may be mounted on and coupled to a flange 106. The flange 106 may provide mechanical support for the die 104 or protect the die 104 from damage that could occur if the die 104 were left exposed. In various embodiments, the flange 106 may be electrically coupled with the die 104. For example, the flange 106 may provide an electrical ground path to which the die 106 may couple. The flange 106 may also provide heat spreading for the package 100.

The flange 106 may be formed from any material suitable the purpose. An electrically- or thermally-conductive or non-conductive material may be suitable. For embodiments in which the flange 106 is electrically coupled to the die 104, the flange 106 may comprise an electrically conductive material. Suitable electrically and thermally conductive materials may include, but are not limited to, copper, tungsten, tungsten-copper (W—Cu), or copper-molybdenum-copper (Cu—Mo—Cu). In various embodiments, the flange 106 may be plated with a conductive material such as gold or other suitable conductive material.

For providing heat spreading capability, the flange 106 may be formed using a material, such as tungsten-copper or similar materials, compatible with high heat flux densities. Accordingly, a relatively small overall size of the package 100 may be achieved while minimizing overheating or thermal impedance issues. Moreover, the small overall size of the package 100 may result in a proportional reduction of thermal expansion and contraction. This reduction in thermal expansion and contraction may advantageously permit the package 100 to operate in applications with wide temperature variations without breaking or tearing the die 104 from the lead frame 102 and resultant functional failure. In various embodiments, for example, relative to packages having input-to-output distances of 230 to 550 mils (approximately 5.7 to 13.8 millimeters) and beyond, a reduction by a factor of 2.5 to 6 may be achieved for the dimensional thermal expansion excursion in lead frame 102 attachment points.

The flange 106 may be coupled to the lead frame 102 using a bonding ring 116 as illustrated. The bonding ring 116 may be configured with a thickness to provide a sufficient clearance between the die 104 and the lead frame 102. The bonding ring 116 may, in various embodiments, provide mechanical reinforcement to the package 100.

As illustrated, the flange 106 includes a platform 118 onto which the die 104 may be mounted. The platform 118 may permit the bonding ring 116 to be aligned with the flange 106 such that the bonding ring 116 surrounds the platform 118 as illustrated. Although the platform 118 is not a necessary feature, it may allow for an increase in the thickness of the bonding ring 116. By increasing the thickness of the bonding ring 116, enhanced mechanical support may be provided. In various embodiments, the bonding ring 116 may be provided with a thickness of 15 mils (approximately 3.7 millimeters) or more.

The lead frame 102 may be metallized (not illustrated) for providing electrical access to the die 104 once the package 100 is encapsulated within the package 100. The lead frame 102 may be coupled to the die 104 by way of conductive bumps 110, such that a first side 112 (backside) of the die 104 is coupled to the flange 106 and a second side 114 of the die 104 is coupled to the lead frame 102. In various other embodiments, however, the die 104 may be coupled to the lead frame 102 in any suitable manner, including, for example, wire bonding. The conductive bumps 110 may comprise any conductive material suitable for electrically coupling the lead frame 102 with circuitry of the die 104 including, but not limited to, conductive bumps comprising solder, gold, or other conductive material. In various embodiments, the conductive bumps 110 may comprise multiple conductive bumps stacked upon each other to form a conductive bump tower. Conductive bump towers may, in embodiments, be used to space the lead frame 102 at an increased distance from the die 104.

Figure 2:
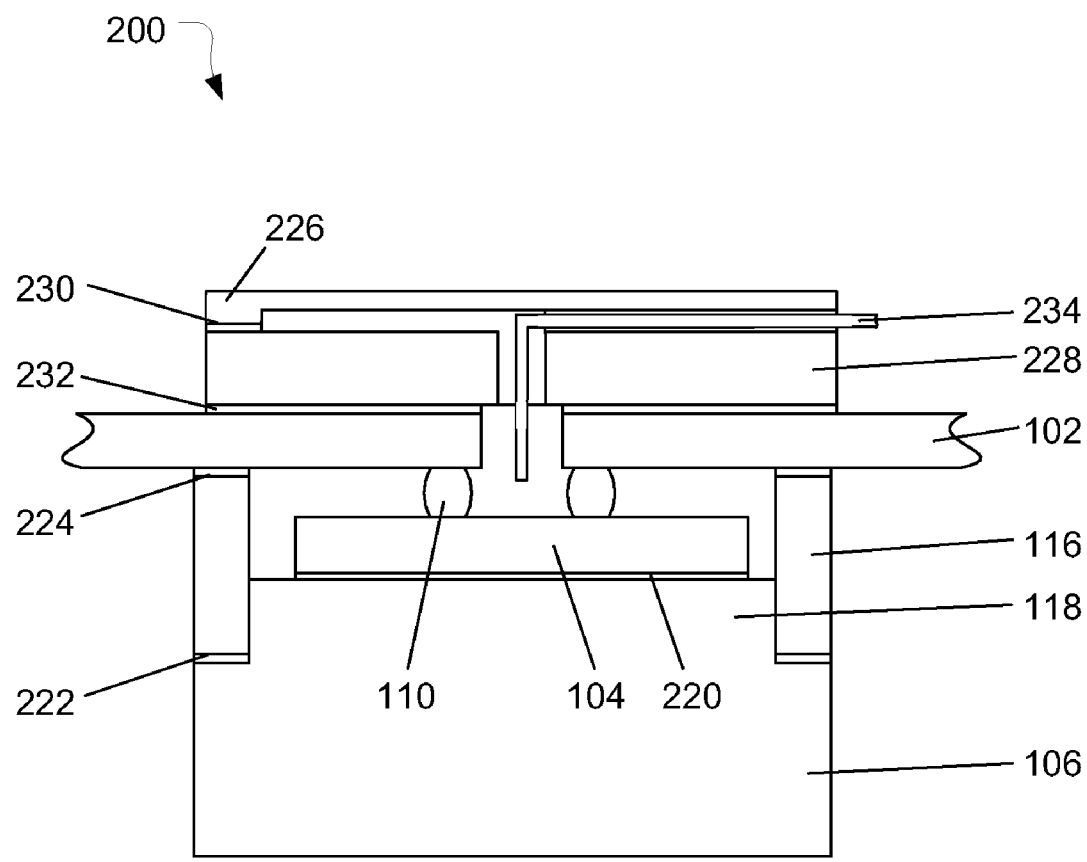
FIG. 2 is a cross-sectional side view of a microelectronic package including a lid in accordance with various embodiments.

Turning now to FIG. 2, illustrated is a cross-sectional end view of a package 200. The package 200 includes many features similar to those of package 100 described herein with respect to FIGS. 1A-1C, and those features are denoted using the same reference numerals. For example, the package 200 includes a die 104 mounted on a platform 118 of a flange 106, a lead frame 102 cantilevered over and coupled to the die 104 using conductive bumps 110, and a bonding ring 116 coupling the flange 106 to the lead frame 102.

The flange 106 and the die 104 may be coupled using any suitable die attach 220 including, for example, adhesive die attach or eutectic die attach. Suitable adhesive die attach materials may include, but are not limited to, adhesives such as polyimide, epoxy, or glass. Suitable eutectic die attach materials may include, but are not limited to, gold (Au), gold-tin (Au—Sn), gold-silicon (Au—Si), lead-silver-indium (Pb—Ag—In), lead-tin (Pb—Sn), or gold-germanium (Au—Ge). For embodiments in which the flange 106 is used for grounding or otherwise electrically coupling with the die 104, the die attach 220 may be a conductive material for providing the conductive pathway between the die 104 and the flange 106.

The bonding ring 116 may comprise an electrically- or non-electrically-conductive material. In various embodiments, the bonding ring 116 comprises epoxy or alumina. The epoxy may be electrically conductive or non-conductive. As electrical isolation may be desired between the lead frame 102 and the flange 106, an electrically conductive or non-conductive material may be used for forming the bonding ring 116, but a layer 222 of electrically non-conductive material may then be situated between the bonding ring 116 and the flange 106, and another layer 224 between the bonding ring 116 and the lead frame 102. Layers 222 and/or 224, in various embodiments, may facilitate bonding between the bonding ring 116 and the flange 106 and/or the lead frame 102.

As illustrated, the package 200 further includes a lid 226 for sealing the die 104. The lid 226 may be formed from any material suitable for the purpose and may be electrically conductive or non-conductive. The package 200 may also include a faraday shield 234 for providing shielding protection.

The lid 226 may be coupled to the lead frame 102 by a bonding ring 228. The bonding ring 228, like bonding ring 116, may comprise electrically conductive or non-conductive material. Layers 230 and/or 232 may be included and may facilitate bonding between the bonding ring 228 and the lid 226 and/or the lead frame 102.

In various embodiments, the lead frame 102 may be proximately positioned, rather than cantilevered, to the die 104, as illustrated at FIGS. 3A-3C. The package 300 includes many features similar to those of packages 100 and 200 described herein with respect to FIGS. 1A-1C and 2, and those features are denoted using the same reference numerals. For example, the package 300 includes a die 104 mounted on a platform 118 of a flange 106, and a lead frame 102 coupled to flange 106 by a bonding ring 116. As illustrated, however, the lead frame 102 is not positioned directly over the die 104. Like the cantilevered lead frame 102 illustrated in FIGS. 1A-1C and 2, however, a dramatic reduction in transmission line lengths, and thus, reduced inductance, may nevertheless be achieved relative to a package with a greater input-to-output distance.

Although the lead frame 102 is depicted as being positioned laterally at a distance d away from the edge of the die 104, the lead frame 102 may be positioned laterally at a distance d of 0 mils away from the edge of the die 104 (i.e., just beyond the edge of the die 104). In various other embodiments, the lead frame 102 may be positioned laterally at a distance d of up to 10 mils away from the edge of the die 104. In still further embodiments, the lead frame 102 may be positioned laterally at a distance d of up to 20 mils away from the edge of the die 104.

As illustrated, the package 300 includes a plurality of wires 310 electrically coupling the lead frame 102 to the die 104. For clarity, only three wires, and only on one side of the die 104, are depicted in FIG. 3A. In embodiments, the package 300 may include more wires 310 along two or more edges of the die 104.

Figure 4A:
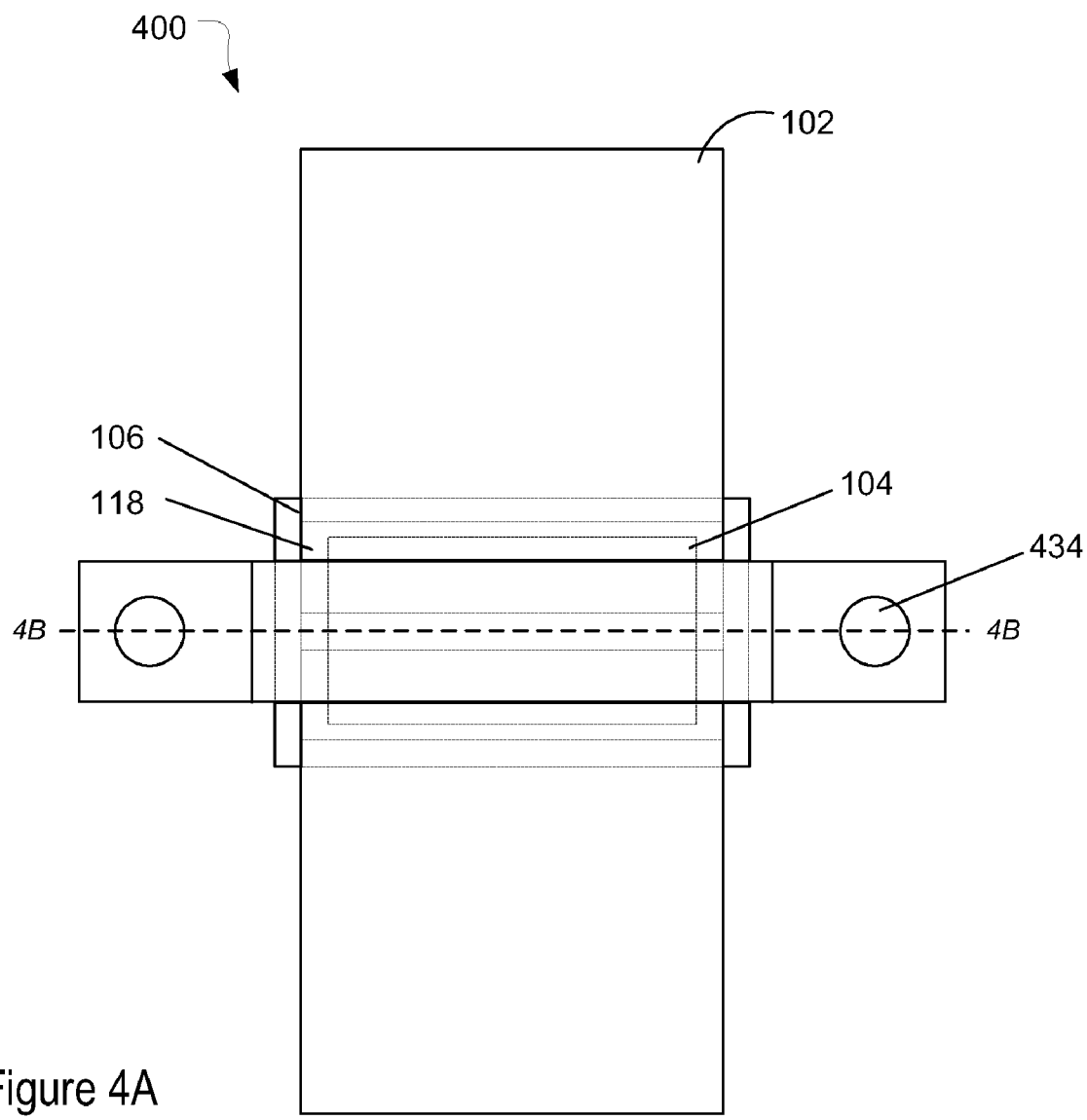
FIGS. 4A and 4B are plan and cross-sectional end views, respectively, of another microelectronic package in accordance with various embodiments.
Figure 4B:
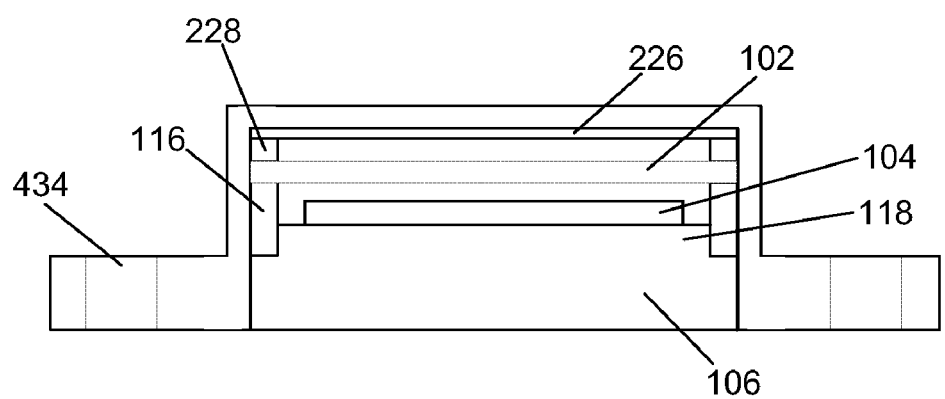

FIGS. 4A and 4B illustrate another embodiment of a package. The package 400 includes many features similar to those of packages 100, 200, and 300 described herein with respect to FIGS. 1A-1C, 2, and 3A-3C, and those features are denoted using the same reference numerals. For example, the package 400 includes a die 104 mounted on a platform 118 of a flange 106, and a bonding ring 116 coupling the lead frame 102 to the flange 106. The package 400 further includes a lid 226 coupled to the lead frame 102 by a bonding ring 228.

The package 400 also includes mounting holes 434. The mounting holes 434 may be configured to allow the package 400 to be bolted to a system level board. The packages 100, 200, and 300, on the other hand, may be soldered to a system level board. Other attachment methods may be possible within the scope of this disclosure.

It should be noted that while the packages illustrated herein are depicted as including only a single die, it will be appreciated that packages in accordance with various embodiments may be implemented with multiple die without departing from the scope of the present disclosure.

Figure 5:
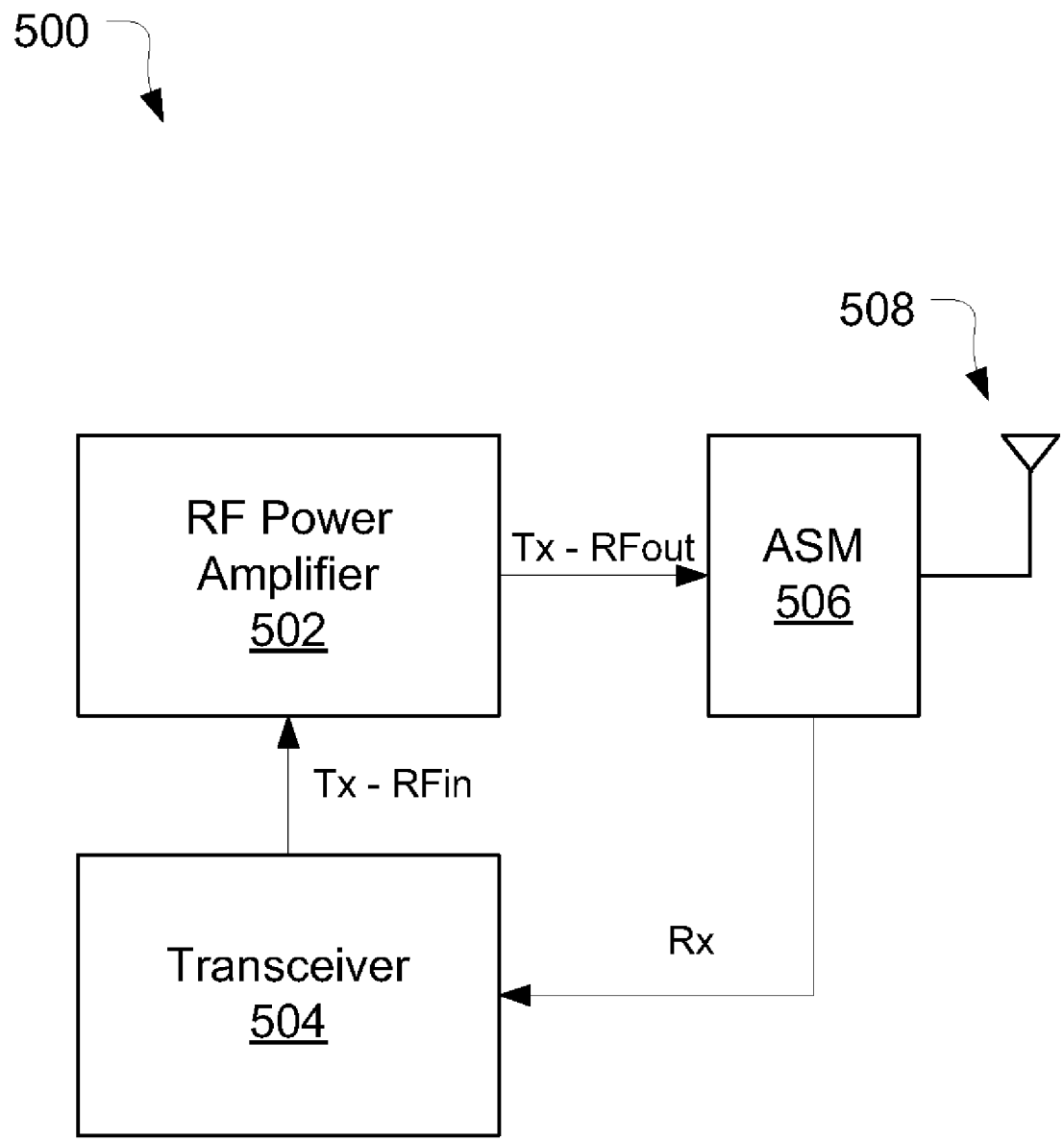
FIG. 5 is a block diagram of a system in accordance with various embodiments.

Embodiments of packages described herein may be incorporated into various apparatuses and systems. A block diagram of an exemplary system 500 is illustrated in FIG. 5. As illustrated, the system 500 includes a radio frequency (RF) power amplifier 502 including a package in accordance with various embodiments of the present invention. The system 500 may include a transceiver 504 coupled with the RF power amplifier 502 as shown.

The RF power amplifier 502 may receive an RF input signal, RFin, from the transceiver 504. The RF power amplifier 502 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 5.

The amplified RF output signal, RFout, may be provided to an antenna switch module (ASM) 506, which effectuates an over the air (OTA) transmission of the RF output signal, RFout, via an antenna structure 508. The ASM 506 may also receive RF signals via the antenna structure 508 and couple the received RF signals, Rx, to the transceiver 504 along a receive chain.

In various embodiments, the antenna structure 508 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 500 may be any system including power amplification. In various embodiments, the system 500 may be particularly useful for power amplification at high radio frequency power and frequency. For example, the system 500 may be suitable for any one or more of terrestrial and satellite communications, radar systems, and possibly in various industrial and medical applications. Radar applications may include military-use radar, air traffic control, navigation, and the like.

In various embodiments, the system 500 may be a selected one of a radar device, a satellite communication device, a mobile handset, a cellular telephone base station, a broadcast radio, or a television amplifier system. The system 500 may find applicability in other applications in which power amplification for high frequency transmission and/or reception is required.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
    a die having a first side and a second side, opposite the first side;
    a lead frame disposed, in part, directly over and coupled to the second side of the die; and
    a flange coupled to the first side of the die by a bonding ring;
    wherein the die is situated on a raised platform of the flange, and the bonding ring is situated beyond a periphery of the raised platform of the flange such that the raised platform is completely within the bonding ring.

2. The apparatus of claim 1, wherein the bonding ring comprises alumina.

3. The apparatus of claim 1, wherein the bonding ring comprises an electrically conductive material, and wherein the apparatus further comprises a non-electrically-conductive material between the bonding ring and the lead frame.

4. The apparatus of claim 1, further comprising a conductive bump to couple the lead frame to the second side of the die such that the conductive bump is directly between the lead frame and the second side of the die.

5. The apparatus of claim 1, wherein the flange comprises tungsten and copper, and wherein the flange is gold-plated.

6. The apparatus of claim 1, further comprising a lid, and wherein the bonding ring couples the lid and the lead frame such that the lead frame is between the lid and the die.

7. The apparatus of claim 6, wherein the bonding ring comprises an electrically conductive material or a non-electrically-conductive material.

8. The apparatus of claim 1, wherein the die, the flange, and the lead frame form a package.

9. The apparatus of claim 8, further comprising one or more mounting holes configured to mount the package onto a system-level board.

10. The apparatus of claim 1, wherein the package has an input-to-output distance of no greater than 150 mils.

11. A system comprising:
    a transceiver to provide a radio frequency (RF) input signal; and
    a radio frequency (RF) power amplifier coupled to the transceiver to receive the RF input signal from the transceiver and to transmit an RF output signal, the power amplifier including:

a die having a first side and a second side, opposite the first side;

a lead frame disposed, in part, directly over and coupled to the second side of the die; and a flange coupled to the first side of the die by a bonding ring;

wherein the die is situated on a raised platform of the flange, and the bonding ring is situated beyond a periphery of the raised platform of the flange such that the raised platform is completely within the bonding ring.

12. The system of claim 11, further comprising an antenna structure operatively coupled to the power amplifier and configured to facilitate transmission of the RF output signal.

13. The system of claim 11, wherein the system is a selected one of a radar device, a satellite communication device, a mobile handset, a base station, a broadcast radio, and a television amplifier system.

14. A method comprising:
providing a die having a first side and a second side, opposite the first side;
coupling a flange to the first side of the die;
coupling a lead frame to the second side of the die, with the lead frame is disposed, in part, directly over the second side of the die; and
coupling the flange and the lead frame using a bonding ring;
wherein the coupling of the flange to the first side of the die comprises situating the die on a raised platform of the flange, and wherein the coupling the flange and the lead frame using the bonding ring comprises disposing the bonding ring beyond a periphery of the raised platform of the flange such that the raised platform is completely within the bonding ring.

15. The method of claim 14, wherein the coupling of the lead frame to the second side of the die comprises coupling the lead frame to the second side of the die by a plurality of conductive bumps such that the plurality of conductive bumps are directly between the lead frame and the second side of the die.

16. The method of claim 14, further comprising coupling a lid to the lead frame using a bonding ring such that the lead frame is between the lid and the die.

* * * * *